(12) United States Patent
Sanders

(10) Patent No.: US 7,932,466 B2
(45) Date of Patent: Apr. 26, 2011

(54) NAUTILUS SELF PRESSURIZING EQUIPMENT ENCLOSURE

(76) Inventor: Dean Sanders, Linden, CA (US)

( * ) Notice: Subject to any disclaimer, the term of this patent is extended or adjusted under 35 U.S.C. 154(b) by 1095 days.

(21) Appl. No.: 11/347,034

(22) Filed: Feb. 4, 2006

(65) Prior Publication Data
US 2007/0209817 A1 Sep. 13, 2007

(51) Int. Cl.
H05K 3/16 (2006.01)
H01L 23/02 (2006.01)
(52) U.S. Cl. .............. 174/17 GF; 174/564; 277/336
(58) Field of Classification Search .......... 174/17 GF, 174/564; 277/336
See application file for complete search history.

(56) References Cited

U.S. PATENT DOCUMENTS 5,907,122 A * 5/1999 Nakamura et al. ........ 174/17 GF
6,075,204 A * 6/2000 Celauro et al. ............ 174/17 GF
7,158,369 B2 * 1/2007 Lammers ..................... 361/604
* cited by examiner Primary Examiner — Hung V Ngo
(74) Attorney, Agent, or Firm — Matlock Law Group, PC; K. Brian Matlock

(57) ABSTRACT

A gasketless waterproof ingress prevention enclosure for electronics wherein the enclosure does not rely on traditional sealing means to restrain water. The enclosure includes a five-sided open bottom air tight cavity comprising a liquid volume fluidly coupled to a gas volume creating a gas-fluid coupling layer, rising in elevation within cavity. Changing cavity pressure equal to rising compressed liquid pressure prevents exposure to said electronic enclosure components to a maximum design depth of 15 feet of water below surface level or a column height of 15 feet of water over the bottom of the enclosure bell bottom, independent of the enclosure's distance below surface grade. The apparatus forms a telescoped and recessed inner chassis assembly in its fully closed position. The prevention enclosure also provides a method for sealing including the steps of gasketless water prevention, electronics mounting, and water damage component protection.

7 Claims, 3 Drawing Sheets

NAUTILUS SELF PRESSURIZING EQUIPMENT ENCLOSURE

BACKGROUND

1. Field of the Disclosure

The present invention relates to prohibiting water ingress in enclosures designed to protect electronics or other components from damage that would occur if the protected components were submerged in water or other liquids. More particularly the present invention, a water ingress prevention enclosure eliminates the need for watertight doors and other sealing gaskets by utilizing an opening in the lowest portion of the enclosure to allow rising water to pressurize the ambient gas trapped in the enclosure thus forming a pressurized chamber to which liquids cannot rise.

2. The Prior Art

The science of pressurized vessels is well known, and was originally postulated by Blaise Pascal (1623-1662 AD) as pressure being the equivalent of density times gravity times height of fluid or gas ($P=pgh$). One type of protective pressurized device is a "diving bell" where the gas inside the diving bell is pressurized as the bell is lowered into the water. The water ingresses the bell until equal pressure exist on the captured gas and the ingress water. The current invention is limited to protecting electronic or electrical equipment from water ingress when water is less than one and one half atmosphere of pressure (one square inch pressurized to 22 pounds force) or fifteen (15) feet of water over the bottom of the enclosure or "bell" opening.

SUMMARY OF THE INVENTION

Accordingly, it is a primary object of the invention to provide a enclosure that will prevent electronic and electrical equipment from being damaged by water when placed in locations below ground level surface grade where the maximum height of water is fifteen (fifteen) feet over the bottom bell opening of enclosure apparatus, and that said water damage prevention shall not rely on gaskets of other mechanical means. The maximum height of fifteen feet of water over the bottom of the bell enclosure may be measured without regard to distance from surface grade allowing the enclosure apparatus to be utilized in a plurality of industrial and environmental applications.

It is yet another object of this invention to provide a means to allow the protected equipment to be withdrawn via guides and bracketry through the open bottom of the "bell" enclosure in order for the electronic or electric components to be serviced.

It is yet another object of this invention to provide a means to allow for the protected equipment to be lockable, latchable or otherwise held in place within the enclosure and provide ingress for electrical conduits.

To attain these objects, the present invention discloses a new waterproof enclosure that does not rely on mechanical gaskets to restrain water ingress, but rather utilizes understood physical phenomenon to prohibit liquid ingress into the enclosure.

In one embodiment of the NautilUs Self Pressurizing Equipment Enclosure, a gasketless, one and one-half atmospheres of pressure waterproof electronics and electrical component enclosure assembly comprises a five-sided open bottom air tight enclosure which utilizes known fluid and pressure dynamics formulas to allow liquids to rise within the enclosure thereby pressurizing the atmospheric gas contained therein to a pressure equal to the rising liquid pressure; thus, preventing exposure to said electronic or electrical equipment contained within the pressurized gas area within the enclosure to a further height than the opening access cavity for a pressure differential prevention of water ingress and a gasketless enclosure attached thereto.

In another embodiment, the NautilUs Self Pressurizing Equipment Enclosure further comprises a concealed locking or latching entry feature, a guide and bracketry inner chassis, rail sleeve telescoping guide assembly, component mounting rear tray panel slidingly coupled thereto, and an open bottom pressure differential cavity and skirt coupled therein.

In another embodiment, the NautilUs Self Pressurizing Equipment Enclosure further comprises a submersible telemetry, control, telecommunications or electronics assembly wherein a concealed locking or latching entry feature, a guide and bracketry inner chassis, rail sleeve telescoping guide assembly, component mounting rear tray panel slidingly coupled thereto, and an open bottom pressure differential cavity and skirt coupled therein for use with telecommunications, utility, energy, electrical and electronics power or control applications.

In yet another embodiment, the NautilUs Self Pressurizing Equipment Enclosure wherein the five-sided open bottom air tight cavity comprises a liquid volume fluidly coupled to a gas volume creating a gas-fluid coupling layer, said gas-fluid coupling layer interface rising in elevation within said cavity thereby changing cavity pressure equal to the rising compressed liquid pressure to a maximum design pressure of 1.5 atmospheres, thereby preventing exposure to said electronic and electrical enclosure to a maximum design depth of 15 feet of water below surface level or equivalent to a column height of 15 feet of water over the bottom of the enclosure bell bottom, independent of the enclosure's distance below surface grade.

In an embodiment, a guide and bracketry inner chassis comprise guides and bracketry allowing the protected equipment to be withdrawn via and through the open bottom of the "bell" enclosure in order for the electronic or electric components to be serviced, a telescoping rail and guide rack assembly, and a five sided tray panel.

In another embodiment of the NautilUs Self Pressurizing Equipment Enclosure the guides and bracketry include sleeve and telescoping features to facilitate full height 150% extension utilizing a rack and rail system with nested guides in fully retracted position.

In yet another embodiment the NautilUs Self Pressurizing Equipment Enclosure comprises a concealed locking or latching entry feature allowing the protected equipment to be secured in place where access is gained through the open bottom of the "bell" enclosure.

In another embodiment the NautilUs Self Pressurizing Equipment Enclosure comprises a means for counterbalancing weight distribution allowing the protected equipment and submersible enclosure to be of lesser weight while still providing the necessary pressure differential to seal the assembly.

In another embodiment a method for providing prevention of water ingress to an electronics or electrical enclosure assembly, comprising the steps of: gasketless water sealing to a depth of fifteen feet, electronics and electrical enclosure and mounting, and protection of said electronics and electrical components from water damage.

BRIEF DESCRIPTION OF THE DRAWING FIGURES

DETAILED DESCRIPTION

Figure 1:
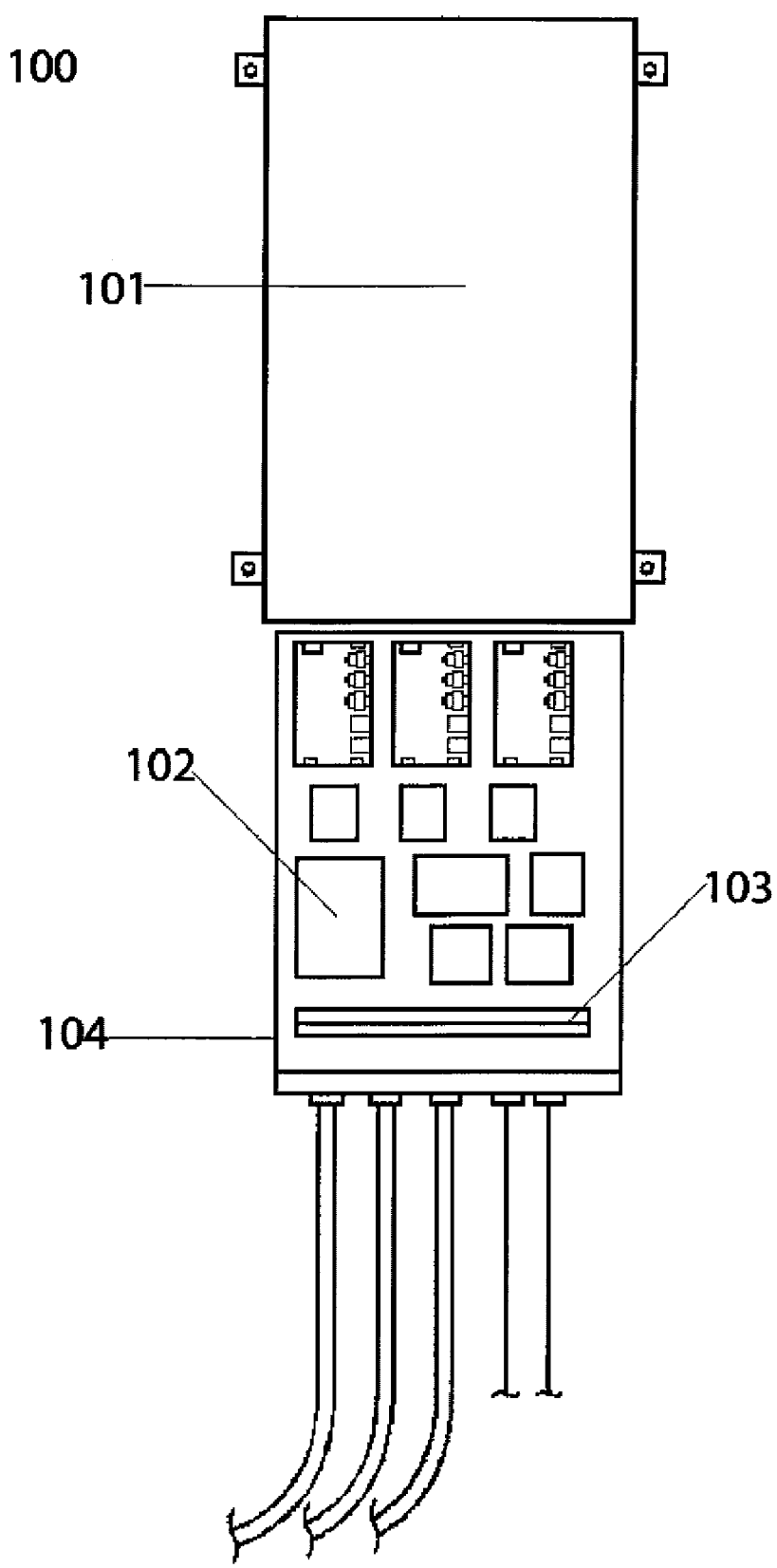
FIG. 1 is an exploded front view of the various components and assembly for an underground control enclosure.

Persons of ordinary skill in the art will realize that the following description is illustrative only and not in any way limiting. Other modifications and improvements will readily suggest themselves to such skilled persons having the benefit of this disclosure.

Accordingly, it is a primary object of the invention to provide an enclosure that will prevent electronic and electrical equipment from being damaged by water when placed in locations below ground level and up to a column height of water equal to fifteen (15) feet independent of depth from surface grade, and that said water damage prevention does not rely on gaskets or other mechanical means. For example, said apparatus and enclosure may be located in a vault or mine far below surface grade such as an underground utility vault, mine or underground storage tank wherein possible water column height when cavity is flooded does not exceed a water column height of fifteen (15) feet. Other engineering applications of distance below grade while maintaining design water column height may be readily apparent to those skilled in the art applying said equipment and enclosures in various environments. In addition, the present apparatus also discloses a retractable positioning means for electronic enclosures to prevent equipment damage from water breaching the enclosure.

It is yet another object of this invention to provide a means to allow the protected equipment to be withdrawn via a guides and bracketry through the open bottom of the "bell" enclosure in order for the electronic or electric components to be serviced.

It is yet another object of this invention to provide a means to allow for the protected equipment to be lockable and provide ingress for electrical conduits.

It is yet another object of this invention to provide a counterbalancing means to reduce weight requirements necessary to lift the protected equipment into the submersible electronics enclosure.

To attain these objects, the present discussion discloses a new gasketless waterproof enclosure that does not rely on mechanical gaskets around the enclosure perimeter to restrain water ingress, but rather utilizes understood physical phenomenon to prohibit liquid ingress into the enclosure. The novel enclosure design utilizes fluid mechanics to protect electrical and electronic equipment from water ingress when water pressure is less than one and one half atmosphere, the equivalent of fifteen feet of water over the bottom of the enclosure or bell opening. It is understood that individual enclosures must be designed with regards to the weight and size of the enclosed equipment to be protected. The drawbacks of seals and gaskets are well known and degrade significantly over time thus allowing ingress of water. The present invention avoids these drawbacks by utilizing an open bell enclosure bottom and further utilizing a concealed locking or latching feature allowing the protected equipment to be secured where access is gained through the open bottom of the "bell" enclosure to the protected equipment. This access is gained with the use of guides and bracketry, a telescoping rail with guide rack assembly, and a multi-sided tray panel allowing the protected equipment to be withdrawn via and through the open bottom of the "bell" enclosure in order for the electronic or electric components to be serviced. The bracketry and telescoping features facilitate the protected equipment multi-sided tray to extend below the "bell" enclosure, or to be fully removed from the enclosure.

According to the teaching of the invention, the gasketless water ingress prevention to a depth of fifteen feet, electronics and electrical enclosure and corresponding mounting, provide secure access and protection of the electronics and electrical components from water damage by means of a concealed padlocking feature allowing the protected equipment to be unlocked or otherwise released to gain entry through the open bottom of the "bell" enclosure.

FIG. 1 is an exploded front view 100 of the various components and assembly for an underground control enclosure.

FIG. 1 is an open front view of the retractable positioning system showing the electronic enclosure 101 with typical electronic equipment 102 that would be protected from water breaching the enclosure, included is the counterbalancing means 103 to offset the weight of the electronics tray 104 and equipment.

Figure 2:
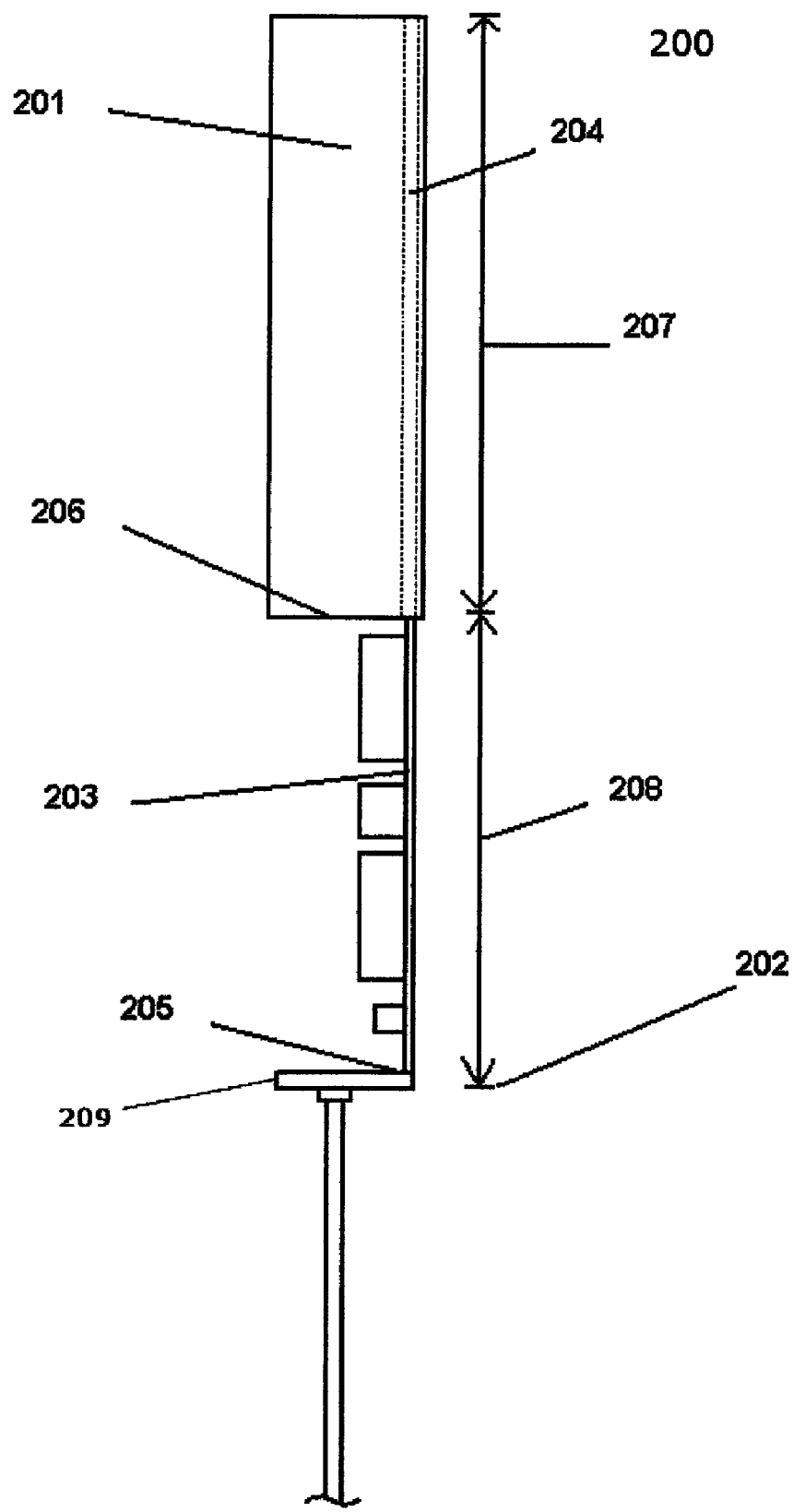
FIG. 2 is a side view of the assembly for an underground control enclosure.

FIG. 2 is a side view 200 of the assembly for an underground control enclosure 201 in its fully extended and open position 202 showing one possible embodiment of a servicing availability position.

FIG. 2 is one embodiment of the underground control enclosure 201; open position 202 access is gained with the use of guides and bracketry 203, a telescoping rail with guide rack assembly 204, and a multi-sided tray panel 205 allowing the protected equipment to be withdrawn via and through the open bottom of the "bell" enclosure 206 in order for the electronic or electric components to be serviced. The sleeve and telescoping features facilitate the electronics tray to be withdrawn from the bell to a distance equal to the electronics tray length 207 plus an extra distance 208 equal to the bell length required to provide one and one-half atmospheric pressurization of the entrapped gas within the bubble. A gasketless water seal 209 prevents escape of pressurized gas and entry of liquid into the enclosure.

Figure 3:
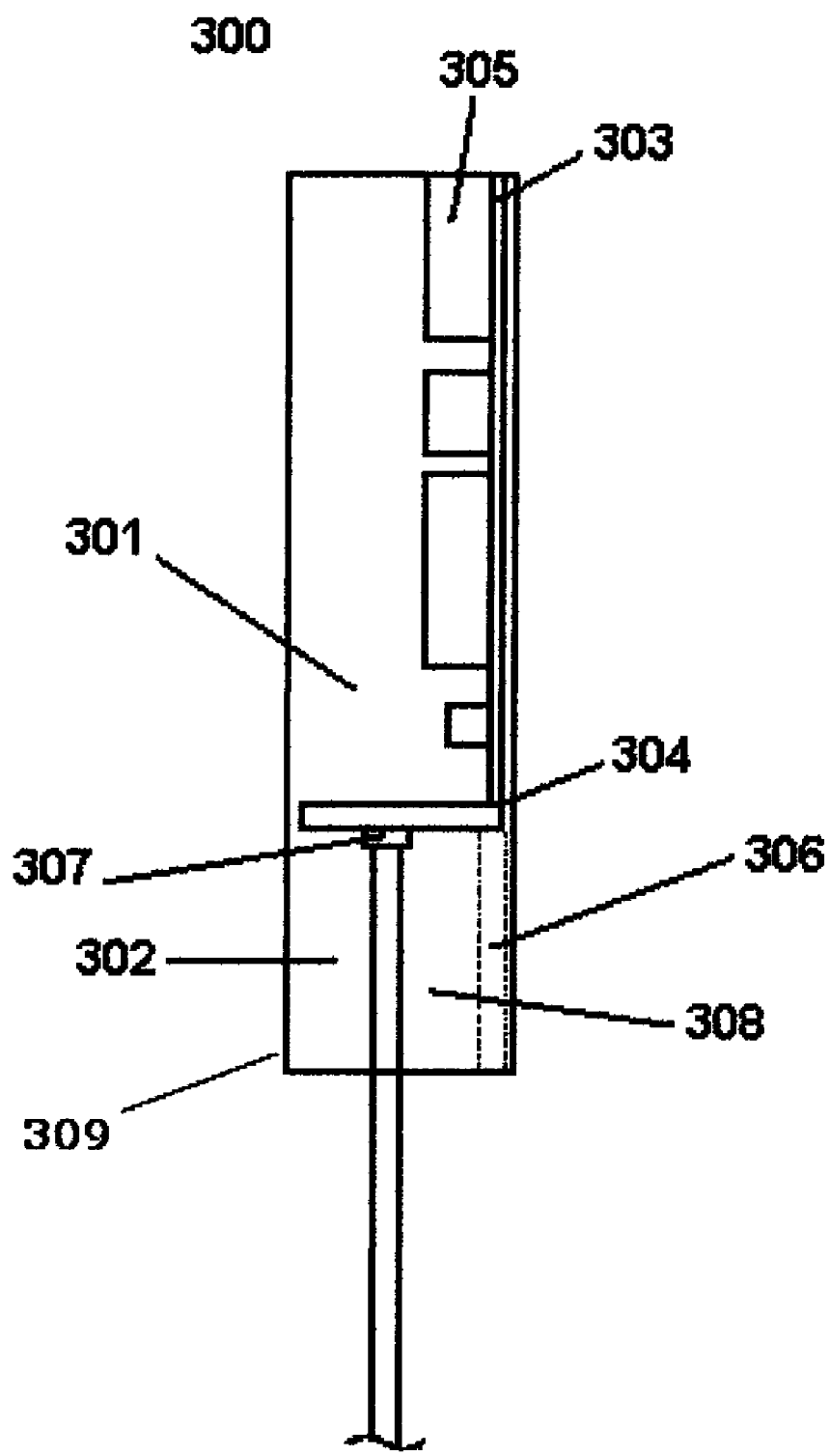
FIG. 3 is an exploded side view of the components within the assembly for an underground control enclosure.

FIG. 3 is an exploded side view 300 of the components within the assembly for an underground control enclosure in its fully recessed and closed position 301 that provide security from tampering, vandalism and full water ingress prevention via the extra volume of air 302 entrapped below the protected electronic or electrical tray 303 and surrounded by a skirt 309.

FIG. 3 is one embodiment of the underground control enclosure providing an enclosure that will prevent electronic and electrical equipment from being damaged by water when placed in locations below ground level to a depth of fifteen (15) feet. Note the water damage prevention does not rely on gaskets or other mechanical means. Rather, a retractable positioning system 304 allows for the protected equipment to be raised to a height within the bell to allow the entrapped gas 308 to be pressurized by a rising fluid, which will cease to rise within the bell when the pressure exerted on the entrapped gas within the bell becomes equal to the pressure of the rising liquid. Thus, protecting the electronic or electric components fastened to the removable multi-sided tray 305. Thereby, utilizing a rack and rail system with nested guides 306 in the fully retracted position, and providing ingress for electrical conduits 307 as well as to prevent equipment damage from water breaching the enclosure.

While embodiments and applications of this disclosure have been shown and described, it would be apparent to those skilled in the art that many more modifications and improvements than mentioned above are possible without departing from the inventive concepts herein. The disclosure, therefore, is not to be restricted except in the spirit of the appended claims.

What is claimed is:

1. A gasketless, waterproof electronics enclosure assembly, comprising:
an open bottom air tight enclosure with a gasketless enclosure attached thereto, said gasketless enclosure comprising a gasketless water seal being the same size as an inner diameter of the open bottom air tight enclosure, thereby preventing fluid ingress into a pressurized gas area and preventing air loss from said pressurized gas area, said pressurized gas area comprising an interior of the open bottom air tight enclosure wherein electronic equipment may be placed, wherein said open bottom air tight enclosure allows liquids to push upward on said gasketless enclosure to a level wherein a total volume contained within said open bottom air tight enclosure comprises a volume of liquid below the gasketless enclosure plus a volume of gas inside the pressurized gas area, wherein an internal pressure of gas equals one and one-half atmospheres (1.5) and wherein an arrangement of electronic equipment components are located within the pressurized gas area within the enclosure at a further height than an opening access cavity to create a pressure differential wherein said pressure differential comprises a difference of fifteen feet of water over the bottom of an enclosure opening such that said pressure differential causes said liquids to push upwards within the open bottom air tight enclosure until the pressure of gas inside the pressurized gas area equals one and one half atmospheres.

2. The apparatus of claim 1 further comprising:
a guide and bracketry inner chassis providing a means for withdrawing protected equipment through an open bottom of said open bottom air tight enclosure;
a rail sleeve telescoping guide assembly;
a component mounting rear tray panel that is slidingly coupled to the rail sleeve telescoping guide assembly;
an open bottom pressure differential cavity;
and a skirt coupled to the gasektless enclosure, wherein said skirt allows fluid to push upward on said gasketless enclosure.

3. The apparatus of claim 2 wherein:
an open bottom air tight cavity comprises a liquid volume fluidly coupled to a gas volume creating a gas-fluid coupling layer, wherein said gas-fluid coupling layer interface rises in elevation within said open bottom air tight cavity thereby changing the internal pressure of gas so as to be equal to a rising compressed liquid pressure to a maximum design pressure of 1.5 atmospheres, thereby preventing liquid exposure to said electronic enclosure components to a maximum design depth of 15 feet of water below surface level and equivalent to a column height of 15 feet of water over the bottom of the open enclosure bell bottom, independent of the enclosure's distance below surface grade.

4. The apparatus of claim 3 further comprising:
a means for counterbalancing weight distribution of the fully retracted enclosure allowing the protected equipment and submersible enclosure to be of lesser weight than the same enclosure with gaskets while still providing the necessary pressure differential to seal the assembly, said means for counterbalancing weight distribution coupled to said rail sleeve telescoping guide assembly.

5. The apparatus of claim 1 further comprising:
a submersible electronics chassis assembly wherein a guide and bracketry inner chassis portion, a rail sleeve telescoping guide assembly, a component mounting rear tray panel that is slidingly coupled the rail sleeve telescoping guide assembly, an open bottom pressure differential cavity, and a skirt coupled to the gasektless enclosure;
wherein a gasketless water seal protects the electronic equipment components up to a maximum water column height of fifteen feet over the bottom of the open enclosure bottom, wherein said maximum water column height creates a pressure differential that causes liquid to push upwards within the open bottom air tight enclosure until the pressure of gas inside the pressurized gas area equals one and one half atmospheres.

6. The apparatus of claim 5 wherein said guides and bracketry include sleeve and telescoping features to facilitate full height 150% extension thereby utilizing a rack and rail system with nested guides in a fully retracted position and wherein said guides and bracketry are strong enough to allow the protected equipment mounted to the tray panel to extend to 150% of the length of said tray panel.

7. The apparatus of claim 1:
wherein the protected equipment is secured in place and wherein access is gained through the open bottom of the enclosure.

* * * * *